(12) United States Patent
Chiang et al.

(10) Patent No.: US 7,981,812 B2
(45) Date of Patent: Jul. 19, 2011

(54) METHODS FOR FORMING ULTRA THIN STRUCTURES ON A SUBSTRATE

(75) Inventors: Kang-Lie Chiang, San Jose, CA (US); Chia-Ling Kao, Moutain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 344 days.

(21) Appl. No.: 12/167,553

(22) Filed: Jul. 3, 2008

(65) Prior Publication Data
US 2009/0035944 A1 Feb. 5, 2009

Related U.S. Application Data

(60) Provisional application No. 60/948,471, filed on Jul. 8, 2007, provisional application No. 60/949,835, filed on Jul. 13, 2007.

(51) Int. Cl.
*H01L 21/31* (2006.01)
*H01L 21/469* (2006.01)

(52) U.S. Cl. ........... 438/780; 438/700; 438/9; 438/637; 257/E21.007; 257/E21.058; 257/E21.216; 257/E21.231; 257/E21.259; 257/E21.264; 257/E21.278; 257/E21.293; 257/E21.311; 257/E21.486; 257/E21.492

(58) Field of Classification Search .............. 438/9, 347, 438/637, 700, 740, 736, 769, 780, 789, 790, 438/13, 931; 257/E21.058, E21.216, E21.231, 257/E21.259, E21.264, E21.278, E21.293, 257/E21.311, E21.486, E21.487, E21.488, 257/E21.492
See application file for complete search history.

(56) References Cited

U.S. PATENT DOCUMENTS

| | | | |
|---|---|---|---|
| 5,843,846 A * | 12/1998 | Nguyen et al. | 438/713 |
| 6,103,635 A * | 8/2000 | Chau et al. | 438/739 |
| 6,235,643 B1 | 5/2001 | Mui et al. | |
| 6,753,264 B2 | 6/2004 | Li et al. | |
| 2003/0228532 A1 | 12/2003 | Mui et al. | |
| 2004/0203177 A1 | 10/2004 | Davis et al. | |
| 2005/0064719 A1 * | 3/2005 | Liu et al. | 438/725 |
| 2006/0194439 A1 | 8/2006 | Sadjadi et al. | |

* cited by examiner

*Primary Examiner* — David Nhu
(74) *Attorney, Agent, or Firm* — Patterson & Sheridan, L.L.P.

(57) ABSTRACT

Methods for forming an ultra thin structure using a method that includes multiple cycles of polymer deposition of photoresist (PDP) process and etching process. The embodiments described herein may be advantageously utilized to fabricate a submicron structure on a substrate having a critical dimension less than 55 nm and beyond. In one embodiment, a method of forming a submicron structure on a substrate may include providing a substrate having a patterned photoresist layer disposed on a film stack into an etch chamber, wherein the film stack includes at least a hardmask layer disposed on a dielectric layer, performing a polymer deposition process to deposit a polymer layer on the pattered photoresist layer, thus reducing a critical dimension of an opening in the patterned photoresist layer, and etching the underlying hardmask layer through the opening having the reduced dimension.

20 Claims, 15 Drawing Sheets

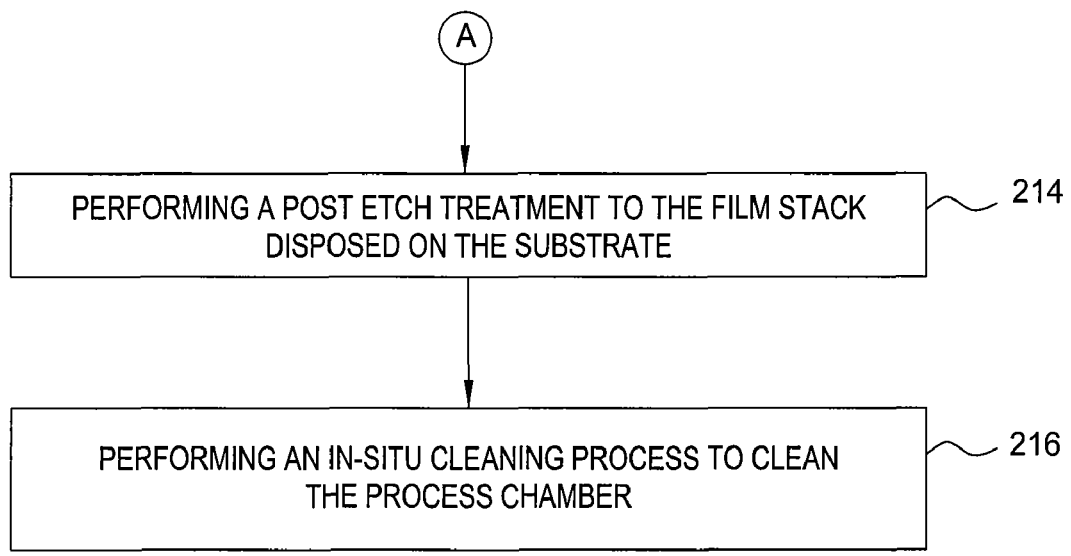
FIG. 2
(CONTINUED)

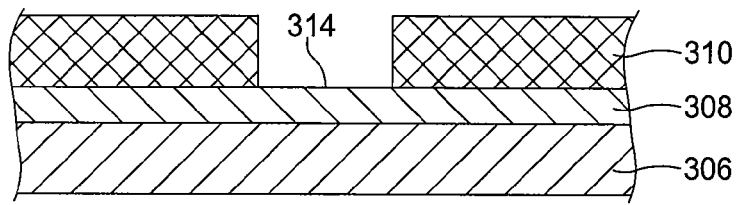
FIG. 4A
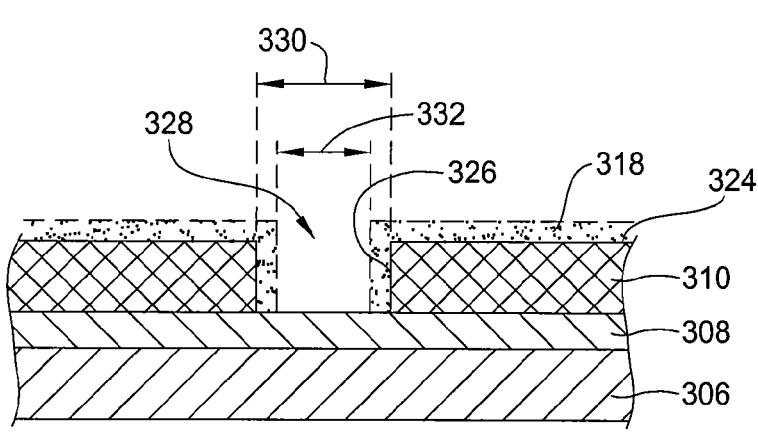
FIG. 4B
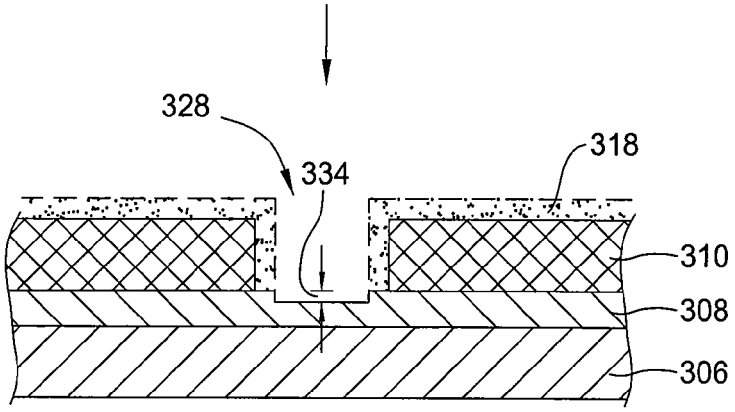
FIG. 4C
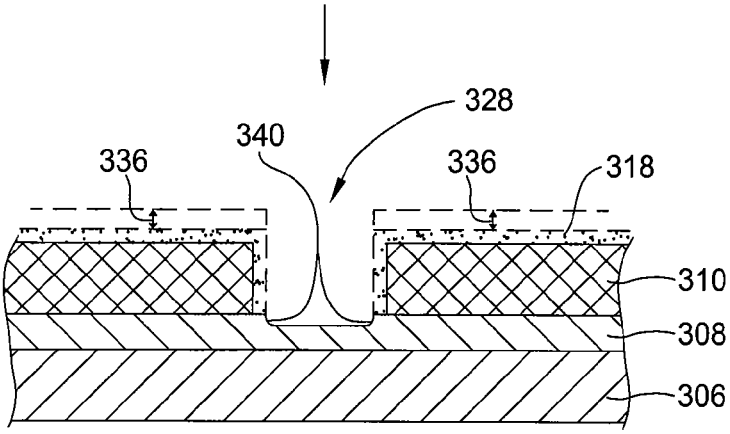
FIG. 4D

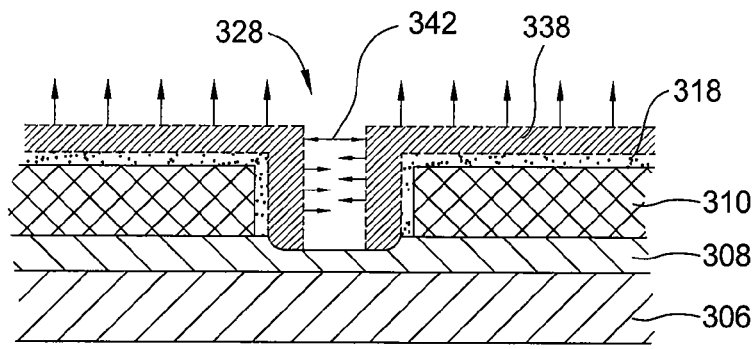
FIG. 4E
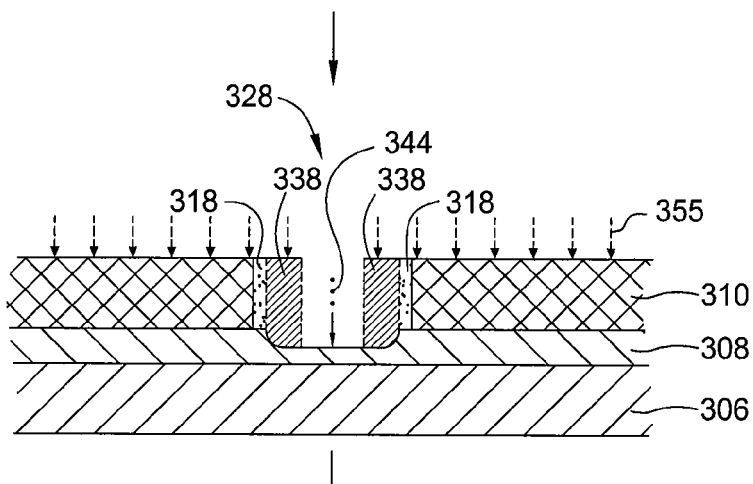
FIG. 4F
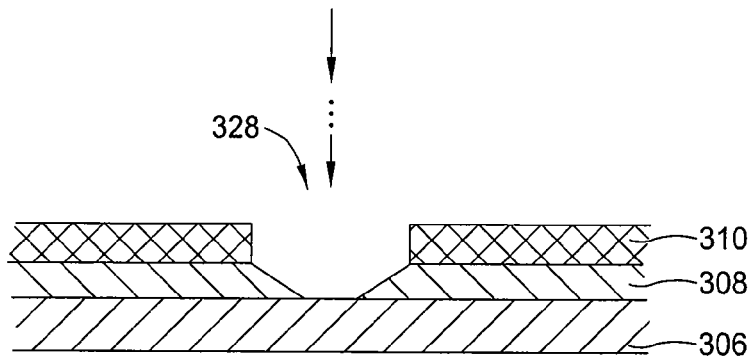
FIG. 4G
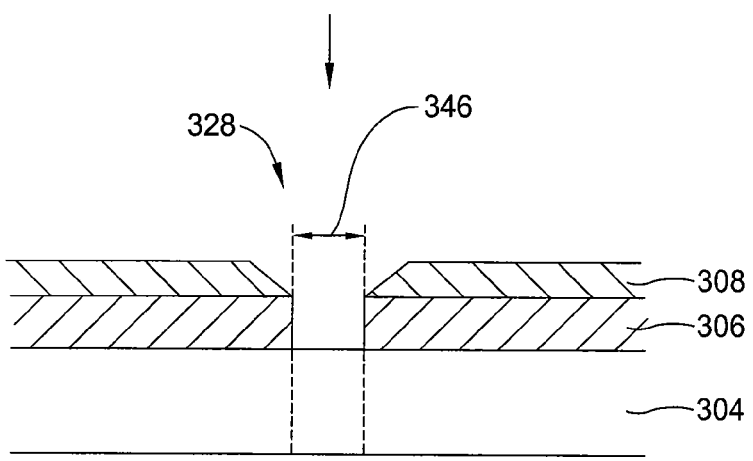
FIG. 4H

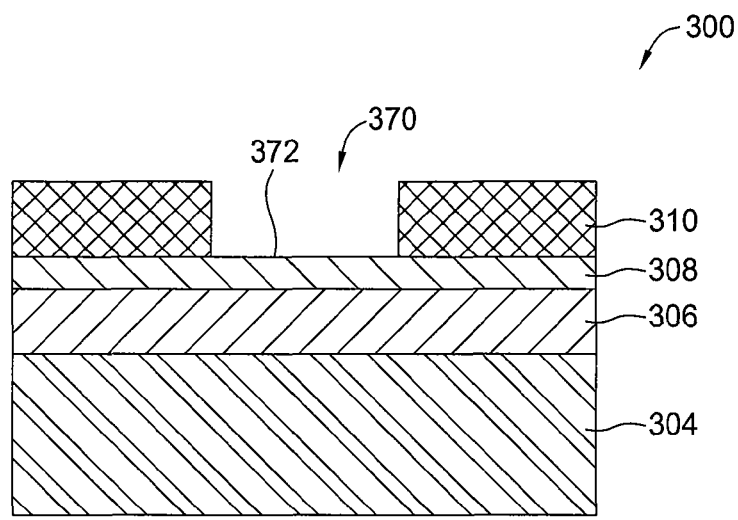
FIG. 5A
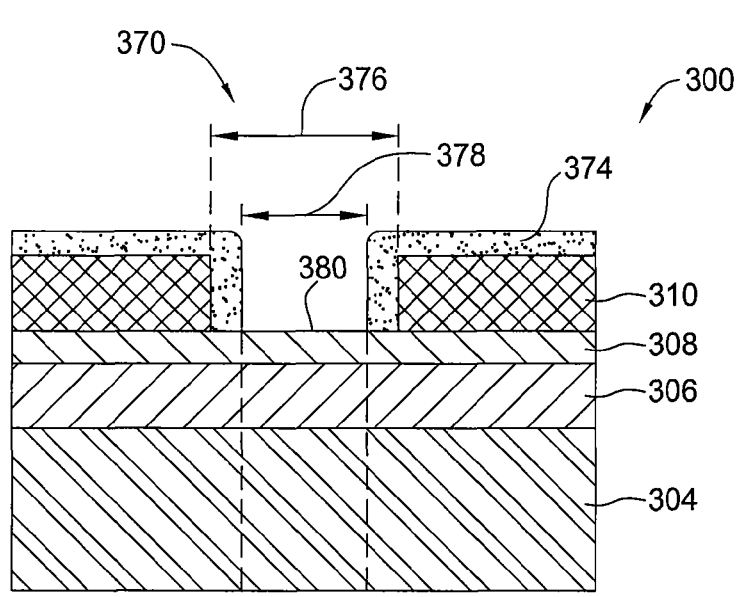
FIG. 5B

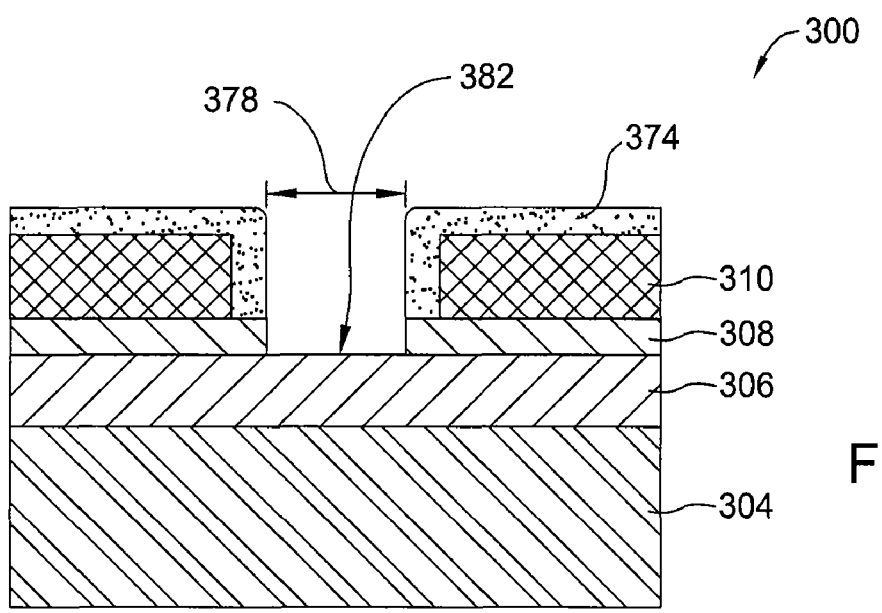
FIG. 5C
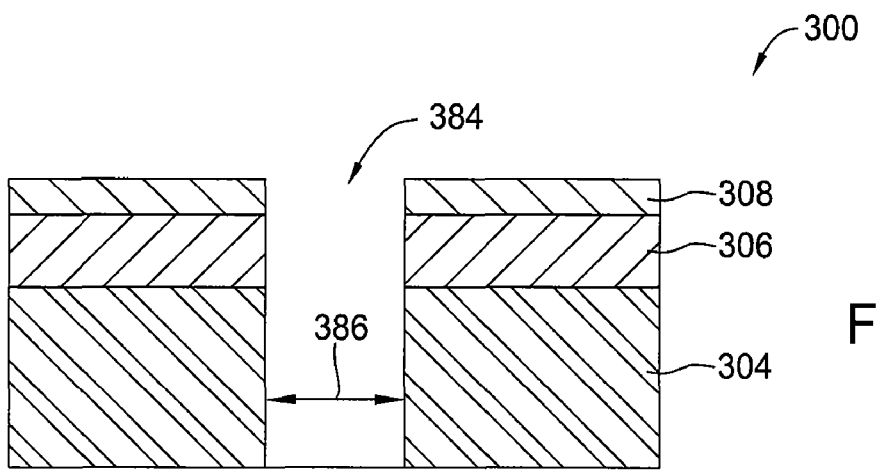
FIG. 5D

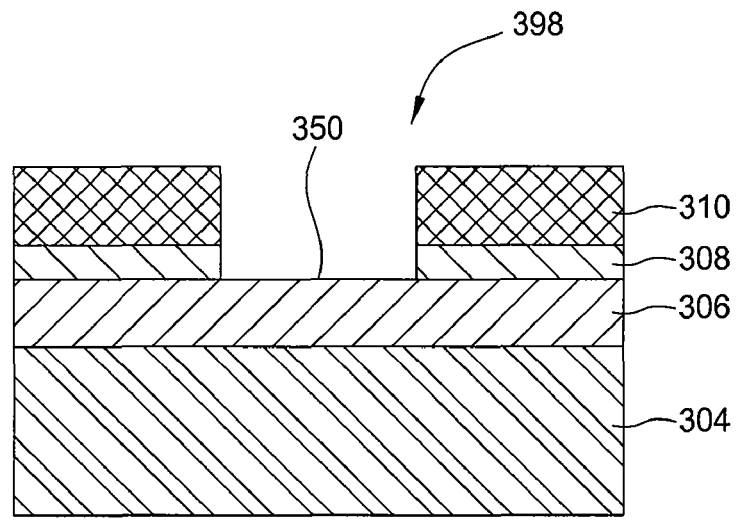
FIG. 6A
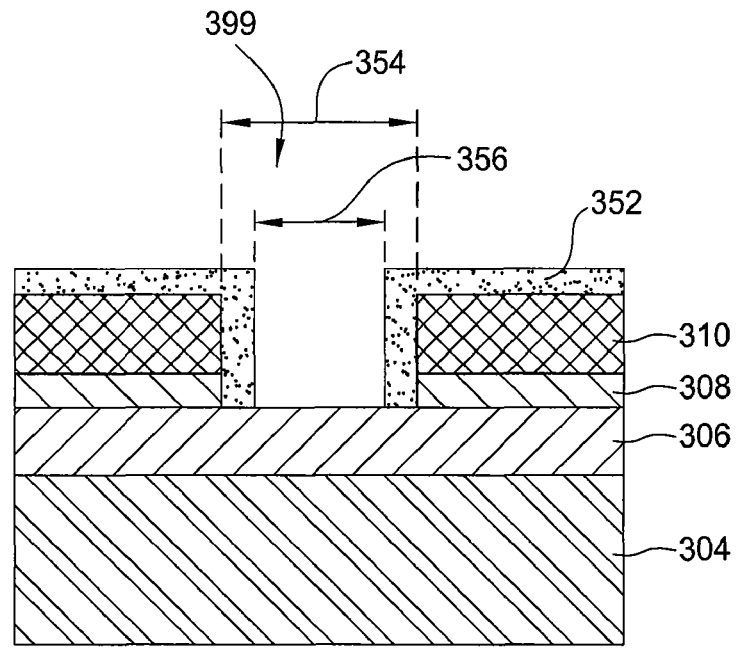
FIG. 6B

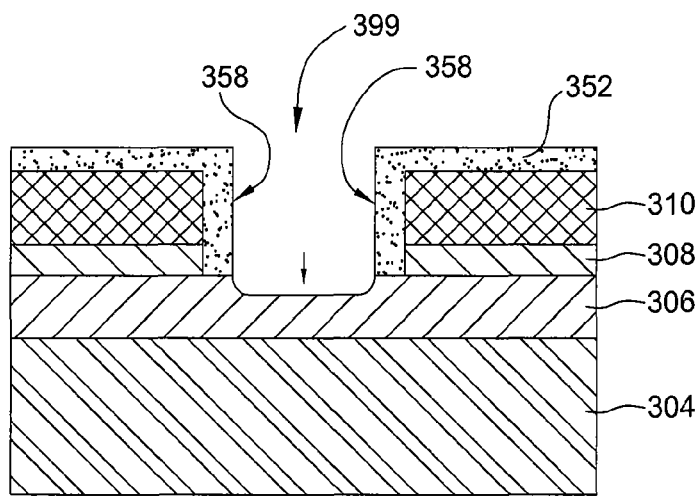
FIG. 6C
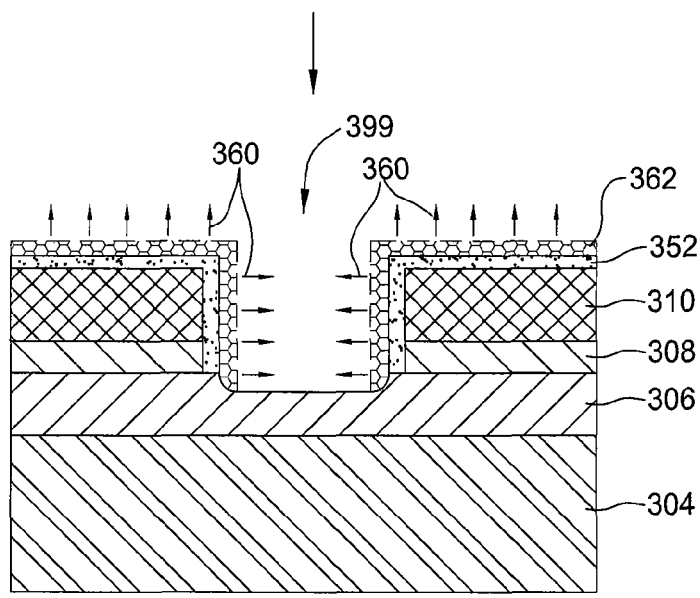
FIG. 6D
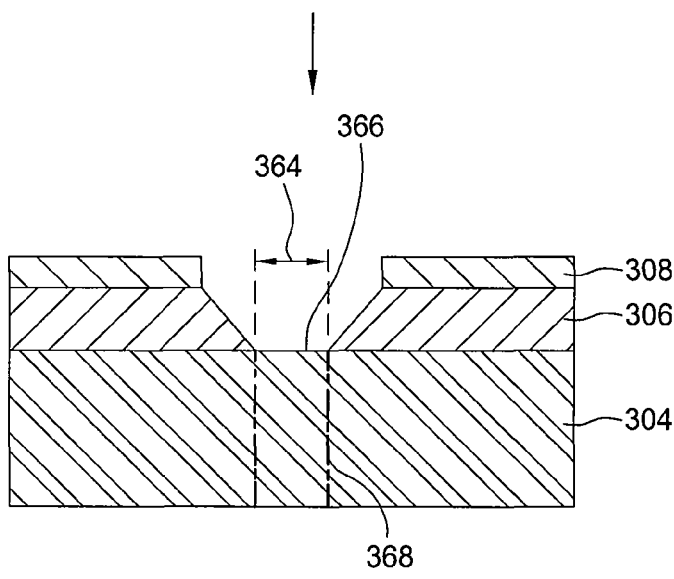
FIG. 6E

METHODS FOR FORMING ULTRA THIN STRUCTURES ON A SUBSTRATE

CROSS-REFERENCE TO RELATED APPLICATIONS

This application claims benefit of U.S. Provisional Application Ser. No. 60/948,471, filed Jul. 8, 2007 and U.S. Provisional Application Ser. No. 60/949,835, filed Jul. 13, 2007, both of which are incorporated by reference in their entirety.

BACKGROUND

1. Field

Embodiments of the present invention generally relates to methods for forming ultra thin structures on a substrate, and more specifically, for using multiple cycles of polymer deposition of photoresist (PDP) and etching to form ultra thin structures on a substrate suitable for semiconductor device fabrication.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structure on the substrate is important to VLSI and ULSI success and to the continued effort to increase circuit density and quality of individual substrates and die.

A patterned mask is commonly used in forming structures, such as contact structure, gate structure, shallow trench isolation (STI), lines and the like, on a substrate by etching process. The patterned mask is conventionally fabricated using a lithographic process to optically transfer a pattern having desired critical dimensions to a layer of photoresist. The photoresist layer is then developed to remove the undesired portions of the photoresist, thereby creating openings in the remaining photoresist through which underlying material is etched.

In order to enable fabrication of next generation, submicron structures having critical dimension of about 55 nm or less, optical resolution limitations of the conventional lithographic process must be overcome to reliably transfer critical dimensions during mask fabrication. Developing new lithographic tools and techniques pose significantly research investment and integration cost. As such, the inventors recognize the potential of extending available fabrication tools to sub 55 nm and smaller device dimensions as one solution for addressing this challenge.

Furthermore, as the geometry limits of the structures for forming semiconductor devices are pushed against technology limits, the lateral dimensions of features of integrated circuits formed on the substrate has shrunk to the point that tighter tolerances and precise process control are critical to successful fabrication. However, with shrinking geometries, precise critical dimension and etch profile control have become increasingly difficult. One problem found during plasma submicron 55 nm etching processes is control of the sidewall roughness of the etched structure, which may result in formation of anisotropic striation. As the dimensions of the features continue to diminish, sidewall striation and/or post-etch sidewall roughness occurrence in small critical dimension structures pose a significant challenge to structure profile integrity, which may ultimately deteriorate overall device performance.

Therefore, there is a need in the art for improved methods to fabricate ultra thin structures on a substrate.

SUMMARY

Embodiments of the invention include forming small dimensional structure on a substrate using a method that includes multiple cycles of polymer deposition of photoresist (PDP) process and etching process. The embodiments described herein may be advantageously utilized to fabricate a submicron structure on a substrate having a critical dimension less than 55 nm.

In one embodiment, a method of forming a submicron structure on a substrate may include providing a substrate having a patterned photoresist layer disposed on a film stack into an etch chamber, wherein the film stack includes at least a hardmask layer disposed on a dielectric layer, performing a polymer deposition process to deposit a polymer layer on the pattered photoresist layer, thus reducing a critical dimension of an opening in the patterned photoresist layer, and etching the underlying hardmask layer through the opening having the reduced dimension.

BRIEF DESCRIPTION OF THE DRAWINGS

The teachings of the present invention can be readily understood by considering the following detailed description in conjunction with the accompanying drawings, in which:

FIGS. 4A-4H are a sequence of cross-sectional views of a film stack processed to form a ultra thin structure on a substrate;

FIGS. 5A-5D are a sequence of cross-sectional views of a film stack processed to form a ultra thin structure on a substrate;

FIGS. 6A-6E are a sequence of cross-sectional views of a film stack processed to form a ultra thin structure on a substrate;

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention generally relate to methods for forming an ultra thin structure on a substrate substantially without sidewall striation and critical dimension loss. In one embodiment, the ultra thin structure formed using at least one cycle of polymer deposition of photoresist (PDP) and etching to form structures with a critical dimension down to 55 nm or less within a dielectric layer. In some embodiments, multiple cycles of polymer deposition of photoresist (PDP) and etching may be used. The method described herein includes a sequential polymer deposition of photoresist (PDP) process and followed by an etching process to gradually etch the underlying layers while maintaining control of features geometry as well as high feature aspect ratio. The method also maintains control of critical dimension transfer as well as retaining good sidewall profile control.

The etch and deposition process described herein may be performed in any suitably adapted plasma etch chamber, for example, an ENABLER® etch chamber, available from Applied Materials, Inc., of Santa Clara, Calif. It is contemplated that suitably adapted plasma etch chambers, including those available from other manufacturers, may also be utilized.

Exemplary Apparatus

Figure 1:
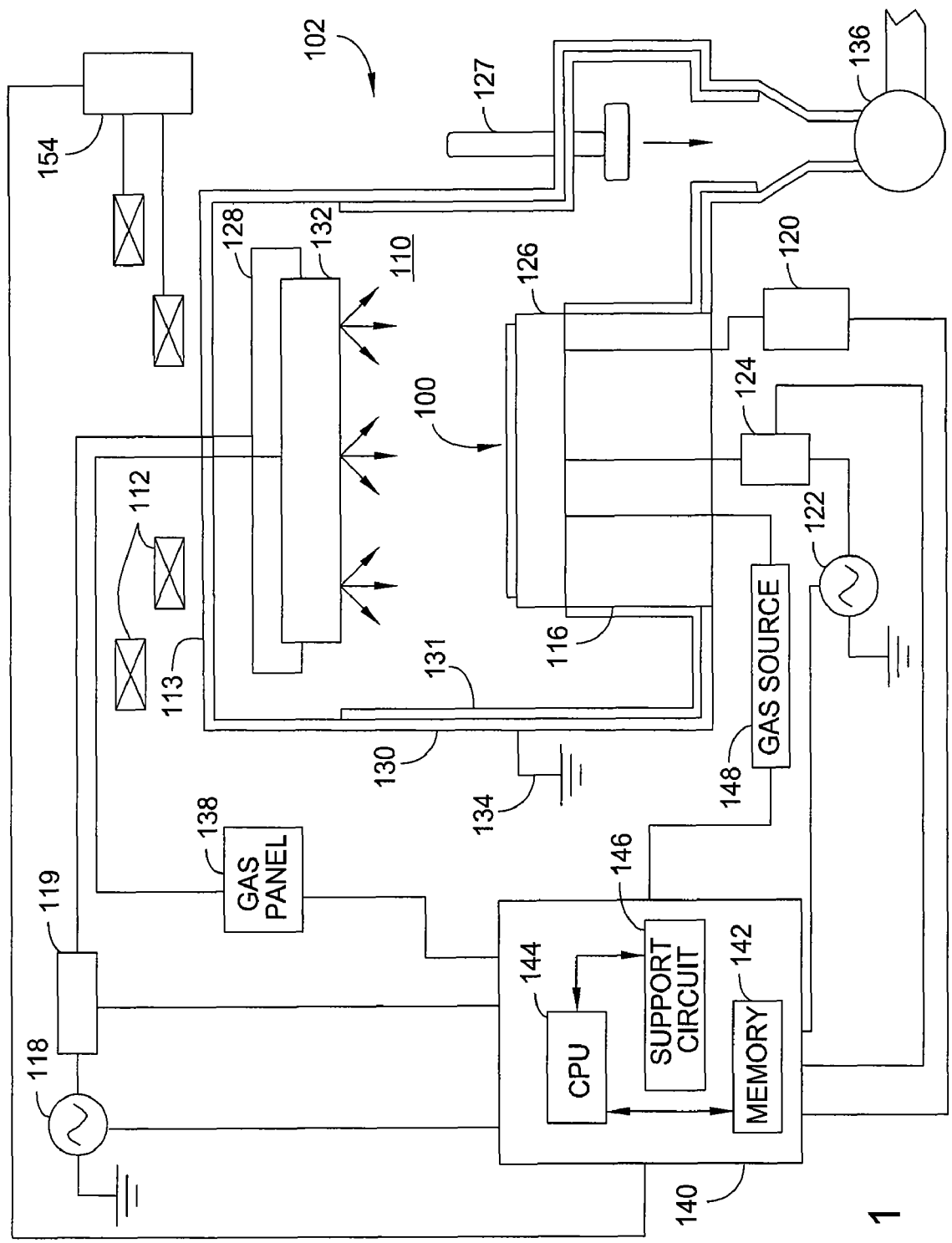
FIG. 1 is a schematic diagram of a plasma processing apparatus used in performing the etching processed according to one embodiment of the invention.

FIG. 1 depicts a schematic, cross-sectional diagram of one embodiment of a plasma source etch reactor 102 suitable for performing the dielectric barrier layer etch according to the present invention. In one embodiment, the reactor 102 includes a process chamber 110. The process chamber 110 is a high vacuum vessel that is coupled through a throttle valve 127 to a vacuum pump 136. The process chamber 110 includes a conductive chamber wall 130. The temperature of the chamber wall 130 is controlled using liquid-containing conduits (not shown) that are located in and/or around the wall 130. The chamber wall 130 is connected to an electrical ground 134. A liner 131 is disposed in the chamber 110 to cover the interior surfaces of the walls 130. The liner 131 facilitates in-situ self-cleaning capabilities of the chamber 110, so that byproducts and residues deposited on the liner 131 can be readily removed.

The process chamber 110 also includes a support pedestal 116 and a showerhead 132. The support pedestal 116 is disposed below the showerhead 132 in a spaced-apart relation. The support pedestal 116 may include an electrostatic chuck 126 for retaining a substrate 100 during processing. Power to the electrostatic chuck 126 is controlled by a DC power supply 120.

The support pedestal 116 is coupled to a radio frequency (RF) bias power source 122 through a matching network 124. The bias power source 122 is generally capable of producing an RF signal having a tunable frequency of from about 50 kHz to about 60 MHz and a bias power of about 0 to 5,000 Watts. Optionally, the bias power source 122 may be a DC or pulsed DC source.

The temperature of the substrate 100 supported on the support pedestal 116 is at least partially controlled by regulating the temperature of the support pedestal 116. In one embodiment, the support pedestal 116 includes a channels formed therein for flowing a coolant. In addition, a backside gas, such as helium (He) gas, provided from a gas source 148, is provided into channels disposed between the back side of the substrate 100 and grooves (not shown) formed in the surface of the electrostatic chuck 126. The backside He gas provides efficient heat transfer between the pedestal 116 and the substrate 100. The electrostatic chuck 126 may also include a resistive heater (not shown) within the chuck body to heat the chuck 126 during processing.

The showerhead 132 is mounted to a lid 113 of the processing chamber 110. A gas panel 138 is fluidly coupled to a plenum (not shown) defined between the showerhead 132 and the lid 113. The showerhead 132 includes a plurality of holes to allow gases provided to the plenum from the gas panel 138 to enter the process chamber 110. The holes in the showerhead 132 may be arranged in different zones such that various gases can be released into the chamber 110 with different volumetric flow rates.

The showerhead 132 and/or an upper electrode 128 positioned proximate thereto is coupled to an RF source power 118 through an impedance transformer 119 (e.g., a quarter wavelength matching stub). The RF source power 118 is generally capable of producing an RF signal having a tunable frequency of about 160 MHz and a source power of about 0 to 5,000 Watts.

The reactor 102 may also include one or more coil segments or magnets 112 positioned exterior to the chamber wall 130, near the chamber lid 113. Power to the coil segment(s) 112 is controlled by a DC power source or a low-frequency AC power source 154.

During substrate processing, gas pressure within the interior of the chamber 110 is controlled using the gas panel 138 and the throttle valve 127. The gas pressure within the interior of the chamber 110 is controllable between about 0.1 to 999 mTorr. The substrate temperature may be controlled between about 10 to about 500 degrees Celsius.

A controller 140, including a central processing unit (CPU) 144, a memory 142 and support circuits 146, is coupled to the various components of the reactor 102 to facilitate control of the processes of the present invention. The memory 142 can be any computer-readable medium, such as random access memory (RAM), read only memory (ROM), floppy disk, hard disk, or any other form of digital storage, local or remote to the reactor 102 or CPU 144. The support circuits 146 are coupled to the CPU 144 for supporting the CPU 144 in a conventional manner. These circuits include cache, power supplies, clock circuits, input/output circuitry and subsystems, and the like. A software routine or a series of program instructions stored in the memory 142, when executed by the CPU 144, causes the reactor 102 to perform an etch process as described below.

FIG. 1 only shows one exemplary configuration of various types of plasma reactors that can be used to practice the invention. For example, different types of source power and bias power can be coupled into the plasma chamber using different coupling mechanisms. Using both the source power and the bias power allows independent control of a plasma density and a bias voltage of the substrate with respect to the plasma. In some applications, the source power may not be needed and the plasma is maintained solely by the bias power. The plasma density can be enhanced by a magnetic field applied to the vacuum chamber using electromagnets driven with a low frequency (e.g., 0.1-0.5 Hertz) AC current source or a DC source. In other applications, the plasma may be generated in a different chamber from the one in which the substrate is located, e.g., remote plasma source, and the plasma subsequently guided into the chamber using techniques known in the art.

Process

Figure 2:
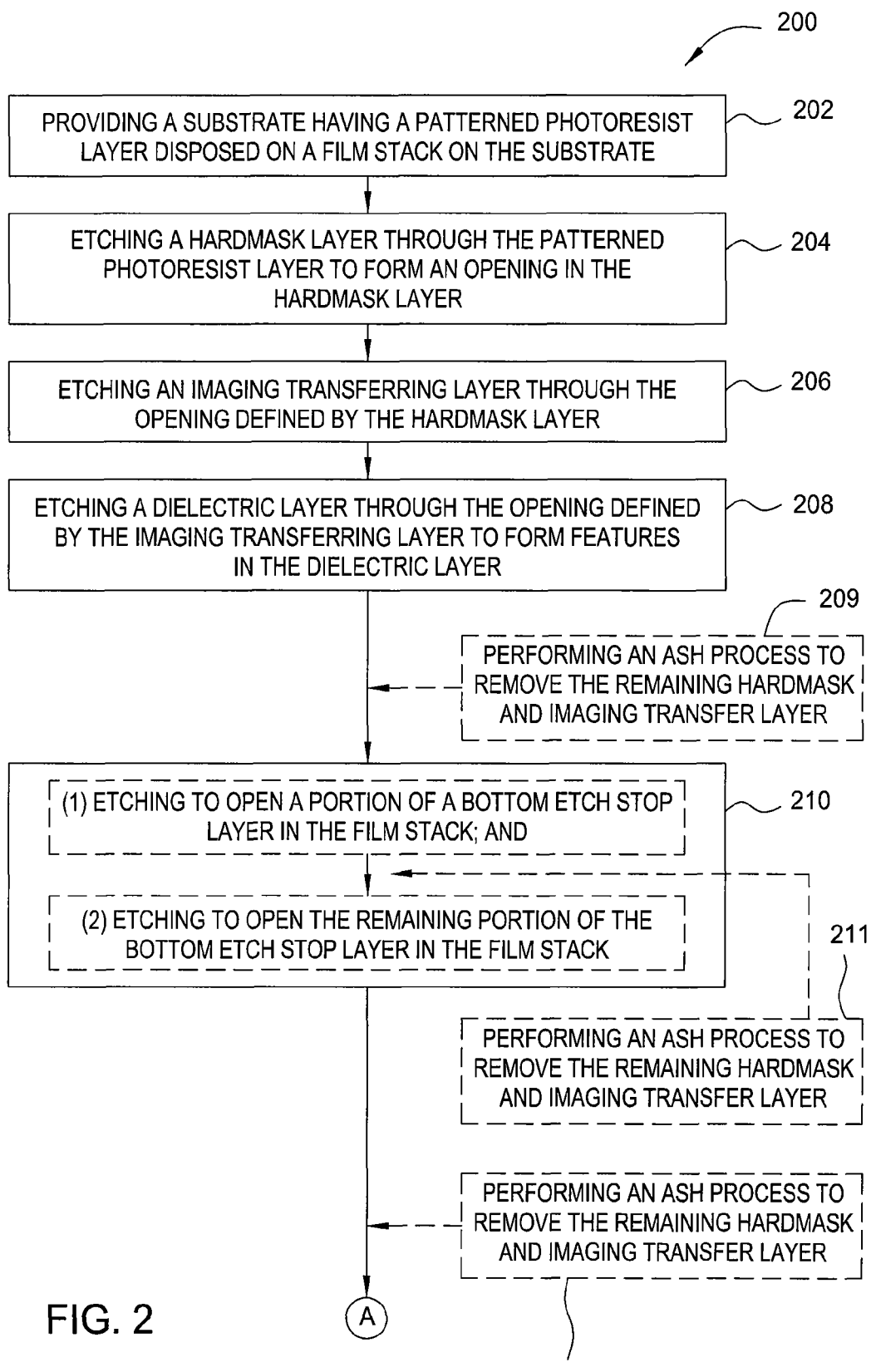
FIG. 2 is a process flow diagram illustrating a method incorporating one embodiment of the invention.

FIG. 2 depicts a flow diagram of one embodiment of an etch process 200 that may be practiced in the reactor 102, as described in FIG. 1, or other suitable processing chamber. FIGS. 3A-3E are schematic cross-sectional views of a portion of a composite substrate corresponding to various stages of the process 200. The process 200 described with connection to FIGS. 3A-3E may be beneficially utilized to fabricate a contact structure of a semiconductor device or the like. The process 200 with reference to FIGS. 3A-3E is an exemplary embodiment that generally illustrates the sequence of forming structures in a dielectric layer disposed on a substrate. Different embodiments of the processes performed in each step are further described with reference to FIGS. 4A-10B.

Figure 3A:
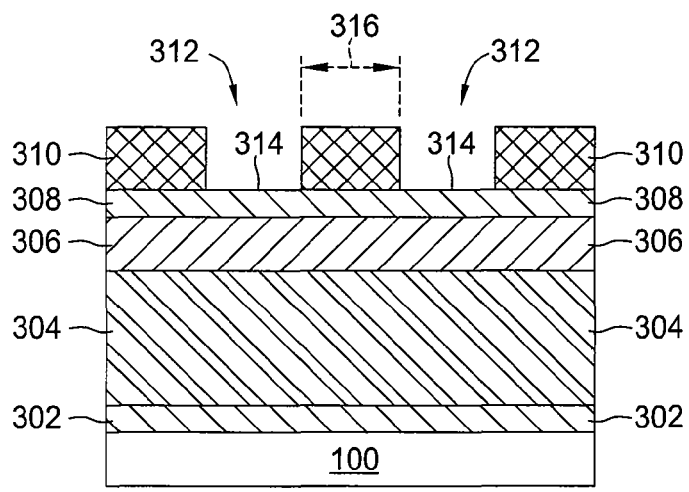
FIGS. 3A-3E are a sequence of cross-sectional views of a film stack processed to form a ultra thin structure on a substrate.

The process 200 begins at block 202 by providing the substrate 100 having a film stack 300 disposed thereon, as shown in FIG. 3A. In the embodiment depicted in FIG. 3A, the film stack 300 has a patterned photoresist layer 310 included as part of the film stack 300 disposed on the substrate 100. In an exemplary embodiment, the film stack 300 is suitable for fabricating a contact structure, but may alternatively be configured to fabricate other structures. The substrate 100 may be any one of semiconductor substrates, silicon wafers, glass substrates and the like. In one embodiment, the substrate 100 may have field effect transistors, such as gate structure, silicide or oxide, source and drain structures formed therein.

In one embodiment, the film stack 300 includes the patterned photoresist layer 310 disposed on a hardmask layer 308 and an image transferring layer 306. The image transferring layer 306 is disposed on a dielectric layer 304. An optional etch stop layer 302 may be disposed on the substrate 100 below the dielectric layer 304. The patterned photoresist layer 310 (e.g. a photomask layer) is disposed on the top of the hardmask layer 308. At least a portion 314 of the hardmask layer 308 is exposed for etching through openings 312 defined in the photoresist layer 310. In embodiments where the hardmask layer 308 is not present, the patterned photoresist layer 310 may be directly formed on the upper surface of the image transferring layer 306, exposing portions of the image transferring layer 306 for etching through the openings 312. In the embodiment depicted in FIG. 3A, the portions 314 of the hardmask layer 308 are exposed through one or more openings 312 defined by the patterned photoresist layer 310 so that the hardmask layer 308 is exposed and ready for etching, as will be further described below.

In one embodiment, the hardmask layer 308 may be in form of a single layer selected from a group consisting of silicon oxide, silicon nitride, silicon carbide, silicon nitride carbide (SiCN), silicon oxynitride (SiON), amorphous silicon (α-Si) or SOG, among other silicon films. Alternatively, the hardmask layer 308 may be in form of a composite film including at least two layers selected from the materials described above.

The image transferring layer 306 may be a carbon containing layer selected from a group consisting of amorphous carbon (α-carbon), and silicon carbide, among others. One example of the image transferring layer 306 described herein is an α-carbon film, such as Advanced Patterning Film™ (APF) available from Applied Materials, Inc.

In one embodiment, the dielectric layer 304 may be a dielectric oxide layer. Other suitable materials for the dielectric layer include undoped silicon glass (USG), such as silicon oxide or TEOS, boron-silicate glass (BSG), phosphorus-silicate glass (PSG), boron-phosphorus-silicate glass (BPSG) and combinations thereof. In an exemplary embodiment depicted herein, the dielectric layer 304 is an undoped silicon glass (USG) layer. In one embodiment, the dielectric layer 304 has a thickness between about 3000 Å to about 15000 Å, such as between about 4000 Å to about 12000 Å, for example about 10000 Å.

The optional etching stop layer 302 may be a dielectric layer having a film property different from that of the dielectric layer 304 to provide a good selectivity therebetween during etching process. In one embodiment, the etching stop layer 302 may be selected from a group consisting of silicon nitride, silicon carbide, silicon nitride carbide (SiCN) and silicon oxynitride (SiON), among other silicon films.

In the particular embodiment depicted in FIG. 3A, the hardmask layer 308 is a single layer of a silicon oxide ($SiO_2$) layer. The image transferring layer 306 is an amorphous carbon film. The dielectric layer 304 is an undoped silicon glass (USG) layer. The bottom etch stop layer 302 is a silicon nitride layer (SiN). The photoresist layer 310 has been patterned by a conventional lithographic process and has openings 312 having an initial critical dimension 316 to expose the portion 314 of the underlying hardmask layer 308 for etching.

Figure 3B:
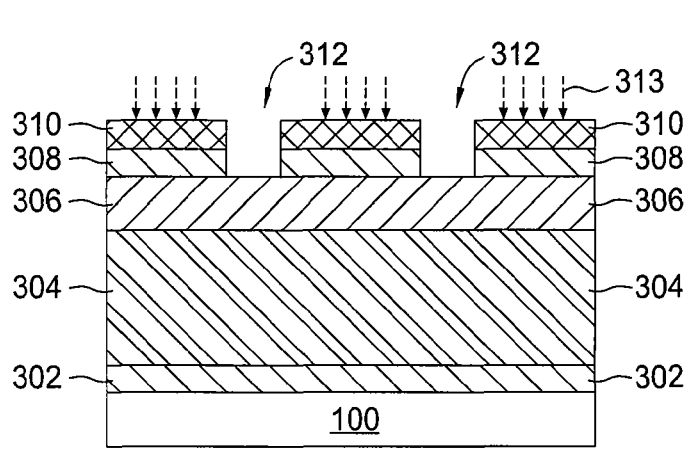

At block 204, the hardmask layer 308 is etched through the opening 312 defined by the patterned photoresist layer 310, as shown in FIG. 3B. During etching, the patterned photoresist layer 310 may be at least partially consumed, as shown by arrow 313. The etched hardmask layer 308 serves as a second etch mask, along with the upper photoresist layer 310, for the subsequent etching process. The hardmask layer 308 may be etched in various manners as will be described further below with reference to FIGS. 4A-5D.

Figure 3C:
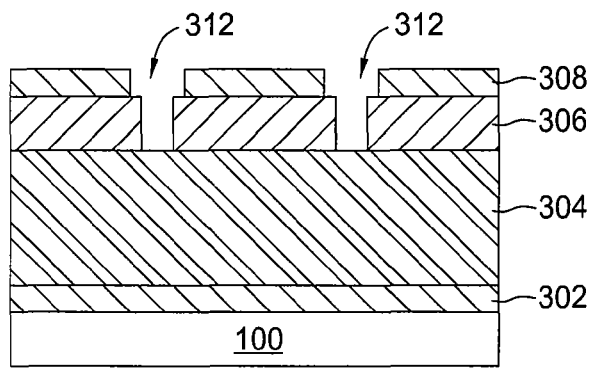

At block 206, the underlying image transfer layer 306 is etched through the etched hardmask layer 308, as shown in FIG. 3C. During etching, the patterned photoresist layer 310 and at least partial of the hardmask layer 308 may be partially or entirely consumed and removed from the substrate 100. Similarly, the image transfer layer 306 may be etched in various manners as will be detail described further below with reference to FIGS. 6A-7C. It is noted that based on different process parameters chosen to perform each etch process, the critical dimension, profile, and/or shape of the hardmask layer 308 and the image transfer layer 306 remaining on the substrate after etching may be varied. The critical dimension and profile of the hardmask layer 308 and the image transfer layer 306, as shown in FIGS. 3B-3C, are exemplary embodiments utilized to facilitate understanding of the etching process, and are not to be considered limiting of its scope.

Figure 3D:
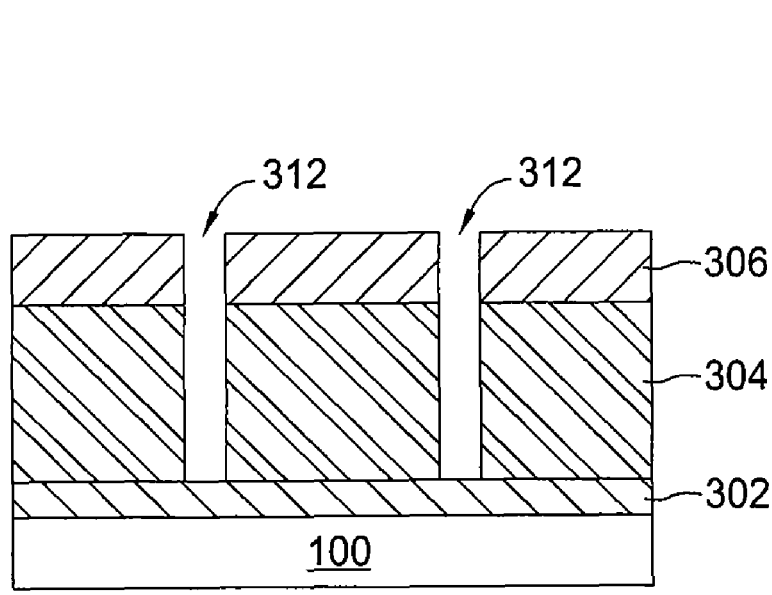
Figure 3E:
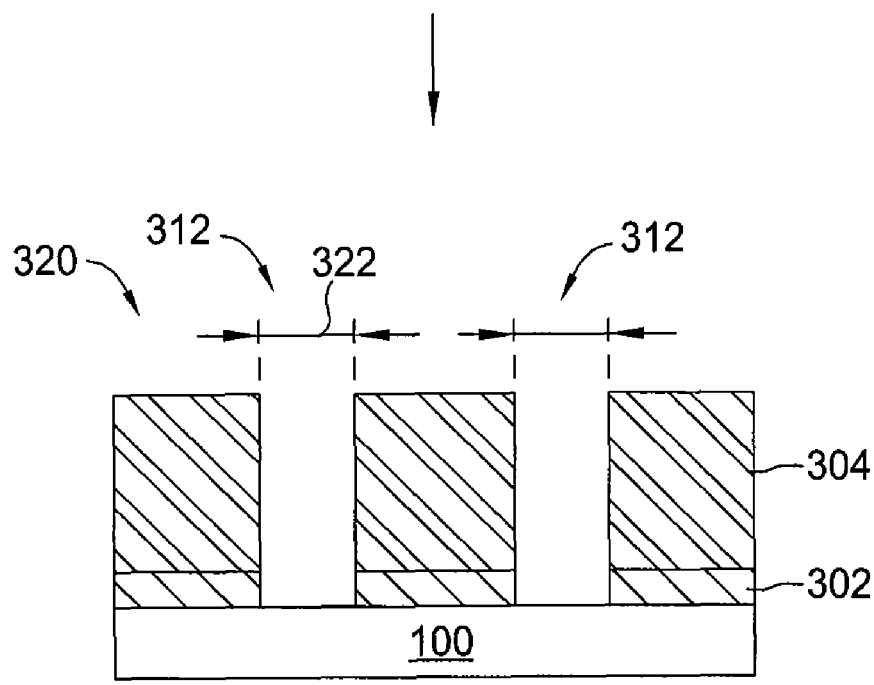

At block 208, the dielectric layer 304 is etched through the patterned image transfer layer 306, as shown in FIG. 3D. At block 210, the underlying etch stop layer 302 is etched through the patterned hardmask layer 308, the image transfer layer 306, and the dielectric layer 304, as shown in FIG. 3E to form structures 320 within the dielectric layer 304 and the etch stop layer 302 with desired critical dimension 322. The etch stop layer etching process may be a single step etching process, or a multiple step etching process. Optionally, in one embodiment, an ash process 209 may be performed to remove the image transfer layer 306 before the etch stop layer 302 has been etched or opened to prevent the underlying device formed in the substrate 100 from being attacked by the gas mixture utilized during the ash process 209. Alternatively, in another embodiment, the ash process 211 may be performed during the etch stop layer removal process to remove the image transfer layer 306 before the etch stop layer 302 has been completely removed for exposing the underlying substrate 100. In yet another embodiment, the ash process 213 may be performed after the etch stop layer 302 has been completely removed through the patterned dielectric layer 304 for removing the patterned photoresist layer 310, opened hardmask layer 308 and the image transfer layer 306 remaining on the substrate 100.

At block 214, after the desired structure 320 has been formed on the substrate 100, a post etching treatment process may be performed to remove surface residuals remaining on the substrate 100. At block 216, an in-situ etching chamber clean may be performed to clean the processing chamber before the next substrate to be processed being transferring into the chamber for processing.

Hardmask Etching Process

Referring back to the hardmask layer etching process performed at block 204, the hardmask layer 308 may be etched in various manners. In one embodiment, the hardmask layer 308 may be etched by at least one or more cycles of alternative polymer deposition of photoresist (PDP) process and hardmask open etching process to sequentially etch the hardmask layer 308 to transfer the critical dimension of the opening 312 as reduced by the polymer layer deposited on the photoresist layer 310. FIG. 4A depicts the patterned photoresist layer 310 disposed on the hardmask layer 308 defining openings 314 of the hardmask layer 308 readily for etching. A first polymer deposition of photoresist (PDP) process is performed by supplying a polymer gas mixture into the etch chamber to deposit a polymer layer 318 on the surfaces of the patterned photoresist layer 310, as shown in FIG. 4B. As polymers 318 are deposited on the surfaces 324 and sidewalls 326 of openings 328 of the patterned photoresist layer 310, the dimension 332 of openings 328 is reduced by the thickness of the deposited polymer 318, and thus narrowing the effective dimension of the opening 328 to a narrower dimension 332. After a sufficient amount of polymer 318 has been deposited to reduce the dimension 332 to a predetermined width, a first hardmask open etching process is performed to etch the underlying hardmask layer 308 through the reduced dimension 332 defined between the polymer 318 lining the sidewalls 326 of the opening 328 to a predetermined depth 334, as shown in FIG. 4C. During etching, the polymer 318 may be at least partially consumed (as shown by arrow 336) by the attack of the reactive etchants present in the gas mixture. As the polymer 318 is removed from the upper surface and sidewall of the patterned photoresist layer 310, the effective area of the opening 328 is gradually enlarged. As the dimension of the opening 328 is enlarged, the area exposing underlying hardmask layer 308 for etching is correspondingly increased, thereby resulting in tapered and/or sloped profile 340 formed on the etched hardmask layer 308.

After etching the hardmask layer 308 for a period of time, but before the polymer 318 is completely consumed, a second cycle of polymer deposition of photoresist (PDP) process and hardmask open etching process may be performed. The second cycle of polymer deposition of photoresist (PDP) process deposits a second polymer layer 338 to reduce the effective dimension of the opening 328 to a predetermined narrower width for the subsequent hardmask open etching process. The cycles of polymer deposition of photoresist (PDP) process and hardmask open etching process may be performed repeatedly until the hardmask layer 308 is completely etched, exposing the underling image transferring layer 306. As shown in FIG. 4E, the second polymer 338 disposed on the existing polymer 318 defines the effective width of the opening 328 between the polymer layers 338 at a predefined desired reduced dimension 342. The second hardmask open etching process is subsequently performed using the newer reduced dimension 342 defined by the second polymer layer 338 to etch the underlying exposed hardmask layer 308.

As the hardmask layer 308 is further etched (as shown by arrow 344), the second polymer 338 may be consumed or the second polymer 338 along with a portion of the patterned photoresist layer 310 may be consumed and removed from the substrate. As the plasma attack may mainly attack the upper surface of the film stack, as shown by arrow 355, rather than the lateral surface of the second polymer 338 and the photoresist layer 310 disposed within the opening 328, the upper surface of second polymer 338 and the photoresist layer 310 may be consumed faster than within the opening 328, as shown in FIG. 4F. As such, a third cycle of polymer deposition of photoresist (PDP) process and hardmask open etching process may be performed. It is noted that the numbers of cycles performed to etch the hardmask layer 308 may be performed as many times as needed. Additionally, the frequency of each cycle may be selected to control the taper of the profile 340. For example, the hardmask layer 310 having higher thickness may need higher number of cycles to remove the hardmask layer 308. After a number of cycles of polymer deposition of photoresist (PDP) process and hardmask open etching process has been performed, the exposed area of the hardmask layer 308 through the opening 328 has been substantially etched, exposing the underlying image transferring layer 306, as shown in FIG. 4G. As the hardmask layer 308 is etched by multiple cycles of polymer deposition and hardmask open etching process, the profile formed in the hardmask layer 308 may be sloped or tapered due to slight dimensional differences of the effective area of the opening as defined by each polymer deposited in each deposition cycle. Subsequently, the underlying image transferring layer 306 may be etched through the opening 328 defined by etched hardmask layer 308 to form an opening with desired reduced dimension 346, as shown in FIG. 4H. During etching, the upper photoresist layer 310 may be at least partially or completely consumed. Accordingly, the underlying dielectric layer 304 may be etched using the etched image transferring layer 306 as an etch mask, as shown in by imaginary lines 348 to form structures with desired reduced dimension, as compared to the dimension of the original opening in the patterned photoresist mask.

The multiple cycles of polymer deposition of photoresist (PDP) and hardmask open etching allows polymers to be gradually deposited on the patterned photoresist layer 310, thereby allowing the underlying hardmask layer 308 to be gradually etched in a controlled manner at critical dimensions less that what could reliably be achieved using conventional lithographic mask-then-etch techniques. The gradual and sequential deposition and etching process prevents the hardmask layer 308 from being over aggressively etched, thereby leaving unwanted striation or critical dimension loss on the formed structure in the film stack 300.

In one embodiment, the polymer gas that may be supplied to deposit polymers on the patterned photoresist layer 310 includes polymer rich chemistries. The polymer rich chemistries typically has a formula $C_xH_yF_z$, where x, y and z are integers greater than 0. Other polymer rich chemistries may have a formula $C_xF_z$, where x and z are integers greater than 3. Alternatively, the polymer rich chemistries may be a carbon based gas. Suitable examples of polymer rich chemistries include $CH_4$, $CH_2F_2$, $CH_3F$, $C_2H_4$, $C_3H_8$, $C_3H_6$, $CF_4$, $CO_2$, $C_5F_8$, $C_4F_6$, combinations thereof, and the like. Other process gases, such as $O_2$ and $H_2$, may also be supplied into the gas mixture. The etching gas mixture that may be used to etch the hardmask layer 308 after polymer deposition include lean chemistries, such as $O_2$, $NH_3$, $H_2$, $SO_2$, combinations thereof and the like. It is noted that $CF_4$, $CO_2$, $CH_4$, $C_2H_4$, $C_3H_8$, and $C_3H_6$ gas may used both as polymer rich chemistries and lean chemistries in the gas mixture, depending on other gas species present in the gas mixture which may reduce the amount carbon-base polymers being deposited. A carrier gas, such as Ar, He, or $N_2$, may also be optionally supplied with the polymer gas into the etch chamber. Several process parameters may also be regulated during processing. In one embodiment, the chamber pressure in the presence of the first trimming gas mixture is regulated between about 2 mTorr to about 200 mTorr, for example, at about 100 mTorr. RF bias power may be applied to maintain a plasma formed from the polymer gas mixture. For example, a power of about 100 Watts to about 1500 Watts, such as about 500 Watts, may be applied to an inductively coupled antenna source to maintain a plasma inside the etch chamber. The polymer gas may be flowed into the chamber at a rate between about 100 sccm to about 500 sccm, such as about 250 sccm. The etching gas mixture may be flowed into the chamber at a rate between about 100 sccm to about 500 sccm, such as about 250 sccm. The inert gas may be supplied at a flow rate about 50 sccm and about 800 sccm, such as about 100 sccm. A substrate temperature may be maintained between about 10 degrees Celsius to about 500 degrees Celsius, such as about 50 degrees Celsius.

Alternatively, the multiple cycles of polymer deposition of photoresist (PDP) and hardmask open etching may be achieved by using different chemistries during the etching process to control the profile formed in the etched hardmask layer 308, rather than alternating deposition and etching steps. For example, a gas mixture includes lean chemistries or polymer rich chemistries may be used simultaneously to deposit a polymer layer as well as etch layers on the substrate 100 to assist forming a sloped or tapered profile on the substrate, thereby assisting gradually opening the underlying layer for etching. Suitable examples of lean chemistries include $CF_4$, $CHF_3$, and CO and suitable examples of polymer rich chemistries include $CH_2F_2$, $CHF_3$, $C_4F_6$ and the like. It is noted that $CHF_3$ gas may also be used both in polymer rich chemistries and lean chemistries, depending on other gas species supplied in the gas mixture (such as oxygen) which would influence the amount of polymer being deposited while etching. It is noted that the simultaneous etching and depositing process may form different profiles, such as tapered, sloped, notched, or the like, on the layer being etched on the substrate to facilitate forming an opening for exposing the underlying layer to form desired features therein during the subsequently etching process.

FIGS. 5A-D depict another embodiment of an etching sequence of the hardmask layer 308 and the file stack 300. FIG. 5A depicts the patterned photoresist layer 310 disposed on the hardmask layer 308 having an opening 370 exposing a portion 372 of the hardmask layer 308 for etching. Similar to as discussed above, a polymer layer 374 is deposited on the patterned photoresist layer 310 to reduce the dimension 376 of the opening 370 down to a narrower width 378, as shown in FIG. 5B. As the dimension 376 of the opening 370 is reduced, the exposed area 380 of the hardmask layer 308 is reduced as well, thereby forming a structure in the hardmask layer 308 with a narrower and/or reduced dimension 378, as shown in FIG. 5C. After an opening 382 is formed in the hardmask layer 308 to the underlying image transferring layer 306 for etching, an image transferring layer etching process and a dielectric layer etching process may be subsequently performed. The polymer layer 374 disposed on the surface of the patterned photoresist layer 310 and the patterned hardmask layer 308 serves as etch mask for etching the image transferring layer 306 and the underlying dielectric layer 304, forming a structure 384 with desired reduced dimension within the dielectric layer 304, as shown in FIG. 5D. Similarly, the upper photoresist layer 310 may be at least partially consumed or completely consumed during the etching process.

Image Transferring Layer Etching Process

Multiple cycles of polymer deposition of photoresist (PDP) and etching may be utilized to etch the image transferring layer 306 at block 206, as illustrated with reference to FIGS. 6A-E. FIG. 6A depicts a portion 350 of the image transferring layer 306 exposed through the patterned photoresist layer 310 and the patterned hardmask layer 308. The hardmask layer 308 may be patterned by conventional etching techniques or by polymer deposition of photoresist (PDP) and hardmask open etching as described above with reference to FIGS. 4A-H. Similar to the multiple cycles of polymer deposition and etching process utilized to etch the hardmask layer 308 described above, a polymer gas may be supplied into the etch chamber to deposit a first polymer 352 on the patterned photoresist layer 310 and the patterned hardmask layer 308, as shown in FIG. 6B. As the polymer 352 deposited on the patterned photoresist 310 and hardmask layer 308, the dimension 354 of the openings 399 is reduced to a narrower width 356, which may be the critical dimension of the structures to be formed. Optionally, the width 356 may be further reduced using additional deposition of photoresist (PDP) and etching techniques.

Subsequently, an image transferring layer open etching process is performed to etch the underlying image transferring layer 306 to a predetermined depth, as shown in FIG. 6C. As discussed above, the polymer may be at least partially consumed (as shown by arrow 358 in FIG. 6C) during etching, a second polymer deposition of photoresist (PDP) may be performed to deposit a second polymer layer 362 on the remaining first polymer layer 352 to maintain the dimension of the opening 399 within a desired reduced range, as shown in FIG. 6D. Similarly, the cycles of the polymer deposition and image transferring layer open etching process may be performed as many times as needed to ensure that the opening in the image transferring layer 306 is etched to a desired dimension.

After the image transferring layer 306 has been etched and defining an opening area 366 with a desired dimension 364 in the underlying dielectric layer 304, the polymer deposition and etching process is considered completed, as shown in FIG. 6E. Similarly, the upper photoresist layer 310 and at least a portion of the hardmask layer 308 may be at least partially consumed or completely consumed during the etching process. The underlying dielectric layer 304 may be accordingly etched (as shown in imaginary lines 368) through the opening 366 defined by the etched image transferring layer 306.

In the embodiments wherein the image transferring layer 306 and the upper deposited polymer layer 362 may both have similar materials, the number of the cycles of deposition and etching may be controlled to minimize the etching cycles, thereby preventing simultaneously and completely etch both the image transferring layer 306 and the upper polymer layer 362 at a similar time.

The multiple cycles of polymer deposition of photoresist (PDP) and image transferring layer open etching controls the effective open area defined by the presence of the polymers deposited on the patterned photoresist 310 and hardmask layer 308, thereby allowing the underlying image transferring layer 306 to be etched to a critical dimension not practical using conventional techniques. The gradual and sequential deposition and etching process prevents the image transferring layer 306 from being over aggressively etched, thereby leaving unwanted striation or critical dimension loss on the formed structure in the film stack 300. Furthermore, it is noted that the profile formed in the image transferring layer 306 may be sloped or tapered due to slight dimension differences caused by each sequence of polymer deposition and etch cycles.

In one embodiment, the polymer gas that may be supplied to deposit polymers on the patterned photoresist 310 and the hardmask layer 308 includes polymer rich chemistries typically has a formula CxHyFz, which x, y, z are integers greater than 0. Other polymer rich chemistries as discussed above may be utilized. Other process gases, such as $O_2$ and $H_2$, may also be supplied into the gas mixture. In one embodiment, the etching gas mixture supplied to etch the image transferring layer 306 includes $CH_4$, $O_2$ and $H_2$.

Several process parameters may also be regulated during processing. In one embodiment, the chamber pressure in the presence of the first trimming gas mixture is regulated between about 2 mTorr to about 100 mTorr, for example, at about 50 mTorr. RF source power may be applied to maintain a plasma formed from the polymer gas mixture. For example, a power of about 100 Watts to about 2500 Watts, such as about 1500 Watts, may be applied to an inductively coupled antenna source to maintain a plasma inside the etch chamber. The polymer gas may be flowed into the chamber at a rate between about 100 sccm to about 1000 sccm, such as about 300 sccm. The inert gas may be supplied at a flow rate about 50 sccm and about 1000 sccm, such as about 400 sccm. A substrate temperature may be maintained between about 10 degrees Celsius to about 500 degrees Celsius, such as about 50 degrees Celsius.

Alternatively, the multiple cycles of polymer deposition of photoresist (PDP) and image transferring layer open etching may be achieved by using different chemistries during the etching process to control the profile formed in the etched image transferring layer 306. For example, a gas mixture includes lean chemistries or polymer rich chemistries may be used simultaneously to deposit a polymer layer as well as etch layers on the substrate 100 to assist forming a sloped or tapered profile on the substrate, thereby assisting gradually opening the underlying layer for etching. Suitable examples of lean chemistries include $CF_4$ and CO and suitable examples of polymer rich chemistries include $CH_2F_2$, $C_4F_6$ and the like. It is noted that $CHF_3$ gas may both be used as polymer rich chemistries and lean chemistries in the gas mixture, depending on other gas species supplied in the gas mixture and the target material properties to be etched. It is noted that the simultaneous etching and depositing process may form different profiles, such as tapered, sloped, notched, or the like, on the layer being etched on the substrate to facilitate forming an opening for exposing the underlying layer to form desired features therein during the subsequently etching process.

Figure 7A:
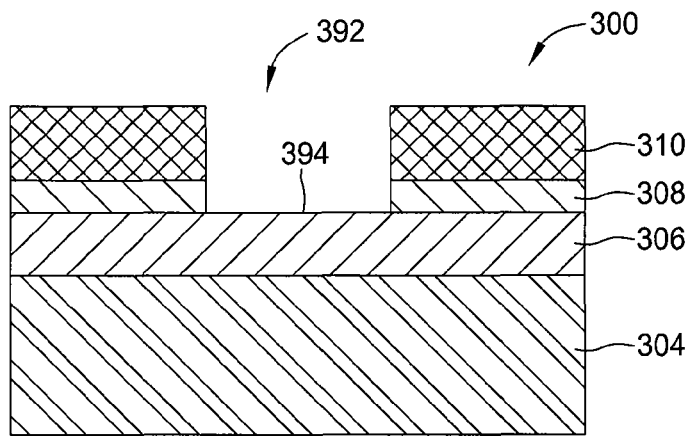
FIGS. 7A-7C are a sequence of cross-sectional views of a film stack processed to form a ultra thin structure on a substrate.
Figure 7B:
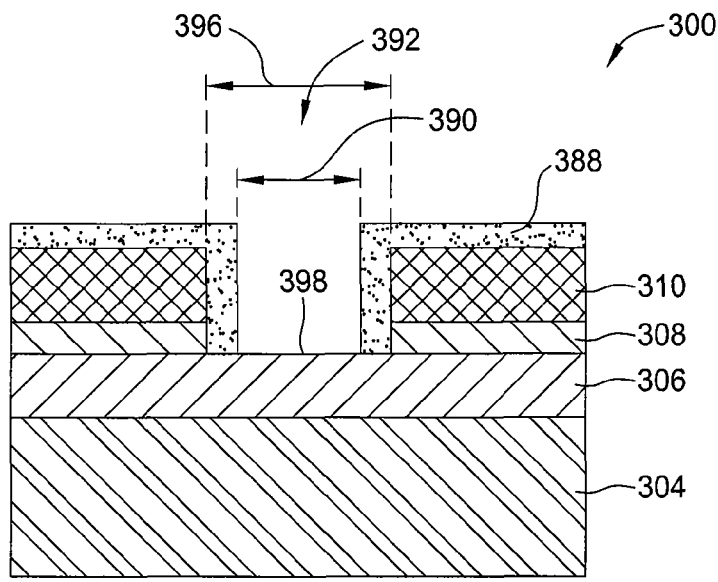
Figure 7C:
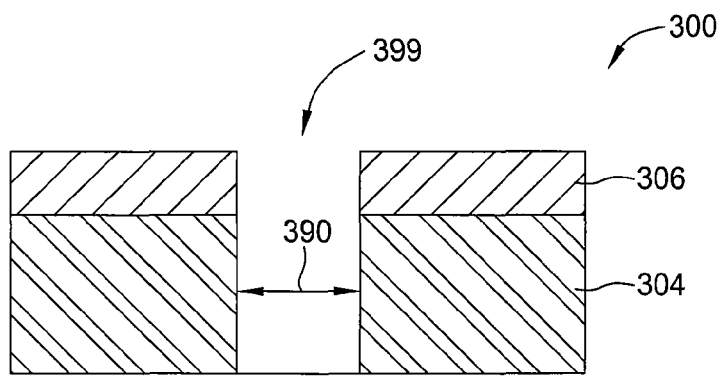

FIGS. 7A-7C depict another embodiment of a sequence for etching the image transferring layer 306 and the file stack 300 disposed on the substrate. FIG. 7A depicts the patterned photoresist 310 and hardmask layer 308 disposed on the image transferring layer 306 having an opening 392 exposing a portion 394 of the image transferring layer 306. Similar to as discussed above, a polymer layer 388 is deposited on the patterned photoresist 310 and the hardmask layer 308 to reduce the dimension 396 of the opening 392 to a narrower width 390, as shown in FIG. 7B. It is noted that the opening of the hardmask layer 308 may be etched by the polymer deposition and etching process as described above or by any suitable conventional techniques. As the dimension 396 of the opening 392 is reduced, the effective area 398 of the image transferring layer 306 exposed for etching is reduced as well, thereby forming a opening 399 in the image transferring layer 306 with a narrower and/or reduced dimension 390, as shown in FIG. 7C. Similarly, the upper photoresist layer 310 and at least a partially of the hardmask layer 308 may be at least partially consumed or completely consumed during the etching process. The underlying dielectric layer 304 is etched through the opening 399 defined by the patterned image transferring layer 306 to form a structure with desired reduced dimension 390 within the dielectric layer 304.

Dielectric Layer Etching Process

Figure 8A:
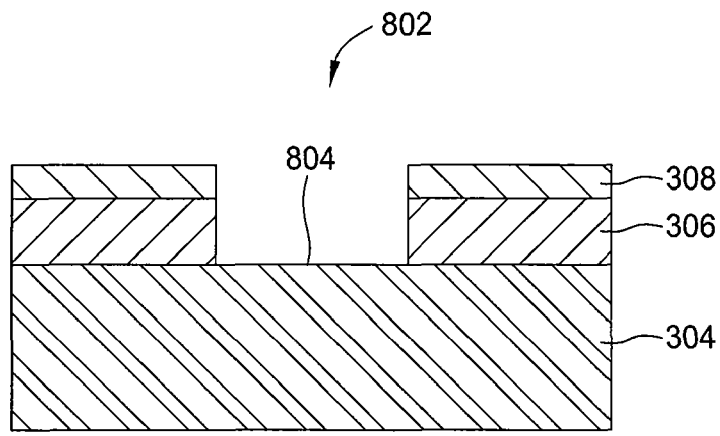
FIGS. 8A-8C are a sequence of cross-sectional views of a film stack processed to form a ultra thin structure on a substrate.
Figure 8B:
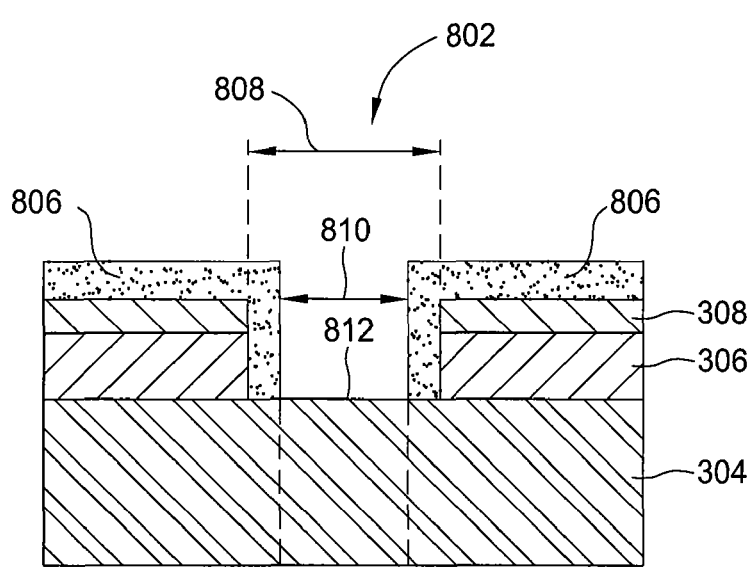
Figure 8C:
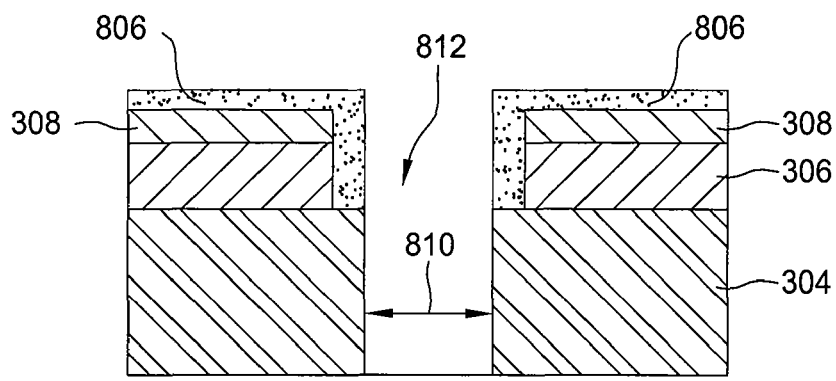

FIGS. 8A-8C depict another embodiment of a sequence for etching the dielectric layer 304. FIG. 8A depicts the hardmask layer 308 and the image transferring layer 306 disposed on the dielectric layer 304 having an opening 802 exposing a portion 804 of the underlying dielectric layer 304. The patterned photoresist layer 310 may or may not be present on the substrate at this process stage. Similar to as discussed above, a polymer layer 806 is deposited on the patterned hardmask layer 308 and the patterned image transferring layer 306 to reduce the dimension 808 of the opening 802 to a narrower width 810, as shown in FIG. 8B. It is noted that the opening of the hardmask layer 308 and the image transferring layer 306 may be etched by the polymer deposition and etching process as described above or by any suitable conventional techniques. As the dimension 808 of the opening 802 is reduced, the effective area 812 of the dielectric layer 304 exposed for etching is reduced as well, thereby forming a opening 812 in the dielectric layer 304 with narrower and/or reduced dimension 810 after the subsequently etching process, as shown in FIG. 8C. It is noted that the hardmask layer 308 and the upper polymer layer 806 may be at least partially consumed or entirely removed during the etching process, thereby leaving the underlying newly defined mask layer for the subsequently etching process.

The gas mixture utilized to etch the dielectric layer 304 is selected to have high selectivity to the upper hardmask layer 308 and the image transferring layer 306. By using selected etchants with high selectivity to the dielectric layer 306 over the upper mask layers (e.g., including both the hardmask layer 308 and the image transferring layer 306), the dielectric layer 304 may be etched without consuming and damaging the upper mask layers. Accordingly, the upper mask layers may resist from the attack from reactive species during etching, thereby facilitating preserving the etched profile of the dielectric layer 304 during etching and providing a striation free or defect free etched profile without critical dimension loss.

In one embodiment, the selectivity of the dielectric layer 304 over the upper mask layers, e.g., the hardmask layer 308, is controlled by supplying a gas mixture including one or more etching gases to etch the dielectric layer 304. The etching gas having relatively high fluorine to carbon ratio, such as $C_4F_8$, has higher reactivity than those etching gas having relatively low fluorine ratio, such as $C_4F_6$. The etching gas having higher fluorine ratio to carbon tends to etch the dielectric layer 304 as well as the upper hardmask layer 308, resulting in poor selectivity between each layers, thereby leading to poor profile control and striations in the formed structure in the dielectric layer 304. In contrast, etching gases having high carbon to fluorine ratio tends to form polymers on the surfaces of the substrate. The excess polymer generated from the higher carbon ratio etching gas may result in by-products and/or residuals being left on the substrate surface. By adjusting the ratio between the etching gases each having high and low ratios of fluorine to carbon elements into the gas mixture, the selectivity between the dielectric layer 304 and the upper mask layers may be efficiently controlled. Additionally, the microloading effect found in the conventional techniques may also be eliminated by providing a greater quantity of the polymerizing gas in the low density area while providing a lower quantity of etching gas in the high density area, or vise versa. In one embodiment, the etching gas may include a mixture containing at least one of $CF_4$, $C_4F_6$, $CHF_3$, $CH_4$, $CH_3F$, CO, $CO_2$ and $CH_2F_2$, $C_4F_8$ and the like.

In a particular embodiment, the etching gases may be used to etch the dielectric layer 304 are $C_4F_6$ and $C_4F_8$. By adjusting the ratio between $C_4F_6$ and $C_4F_8$ gas, the mask to dielectric layer selectivity may be efficiently controlled. In one embodiment, the selectivity of the dielectric layer 304 over the hardmask layer 308 is controlled between about 3 and about 7.5. The ratio of the $C_4F_8$ gas to the $C_4F_6$ gas may be controlled between about 0.2 and about 1.5. Furthermore, an oxygen containing gas may be supplied in the gas mixture. Suitable example of the oxygen containing gas includes $O_2$, $NO_2$, $N_2O$ and the like. An inert gas or carrier gas, such as Ar, He, and N2, may also be supplied in the gas mixture. In an exemplary embodiment described herein, the gas mixture used to etch the dielectric layer 304 includes $C_4F_6$, $C_4F_8$, $O_2$ and Ar.

Several process parameters may also be regulated during dielectric etching processing. In one embodiment, the chamber pressure in the presence of the first trimming gas mixture is regulated between about 2 mTorr to about 100 mTorr, for example, at about 20 mTorr. RF source power may be applied to maintain a plasma formed from the polymer gas mixture. For example, a source power of about 100 Watts to about 1500 Watts, such as about 200 Watts, may be applied to an inductively coupled antenna source to maintain a plasma inside the etch chamber. Additionally, a dual frequency of RF power may be used along with the selected etching gas chemistries, as described above, to eliminate microloading effect during the dielectric layer etching process. In one embodiment, the frequencies used for the RF bias power may be about 13 MHz and 2 MHz respective. The bias power applied in the gas mixture is between about 1500 Watts and about 8000 Watts, such as about 5000 Watts to maintain the plasma inside the etch chamber The polymer gas may be flowed into the chamber at a rate between about 5 sccm to about 100 sccm, such as about 50 sccm. The inert gas may be supplied at a flow rate about 50 sccm and about 1500 sccm, such as about 800 sccm. A substrate temperature may be maintained between about 10 degrees Celsius to about 500 degrees Celsius, such as about 50 degrees Celsius.

Etch Stop Layer Etching Process

As described above at block 210 of process 200 of FIG. 2, the etch stop layer 302 is removed and etched using the etched dielectric layer 304 as a etch mask. In one embodiment, the etch stop layer 302 may have a thickness between about 200 Å to about 1500 Å, such as greater than about 1200 Å. The etching gas utilized to etch the etch stop layer 302 is desired to have a high selectivity to the upper mask layers and the dielectric layer 304, along with the underlying layers used to fabricate the devices formed in the substrate 100. Suitable examples of gas include $CH_2F_2$, $CHF_3$, $CH_3F$ and the like. In one embodiment, $CH_2F_2$ is used to etch the etch stop layer 302. $CH_2F_2$ is a polymerizing gas having a high selectivity to silicides and oxides deposited on the substrate 100, thereby eliminating the potential of damaging the underlying devices in the substrate 100, as the etch stop layer 302 is broken through. Furthermore, an inert gas or a carrier gas, such as Ar, He, $N_2$, or combinations thereof, may be supplied with the etching gas to etch the etch stop layer 302. In one embodiment wherein $N_2$ gas is utilized as carrier gas to be supplied with the $CH_2F_2$ gas into the etching chamber, the ratio between the $N_2$ and the $CH_2F_2$ gas may be controlled at between about 1 and about 2. The Ar gas flow may be provided at about 100 sccm.

Descum Process

Figure 9A:
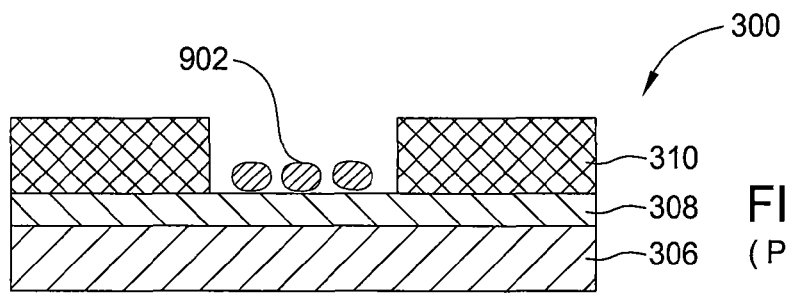
FIGS. 9A-9B are a sequence of cross-sectional views of a film stack of performing a conventional descum process on a film stack utilized to form a ultra thin structure on a substrate.
Figure 9B:
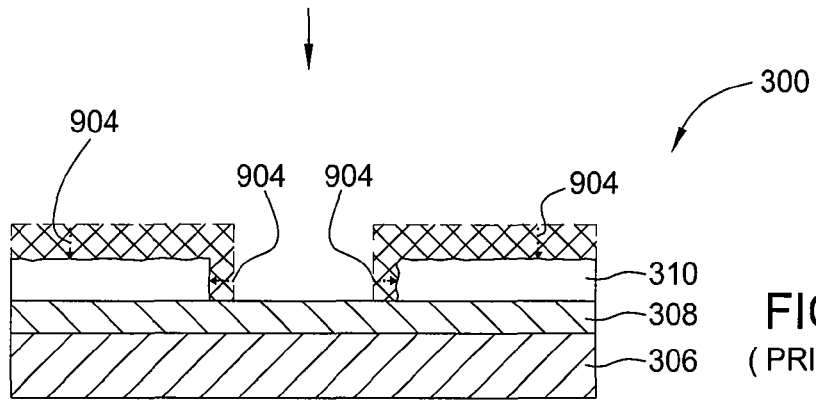
Figure 10A:
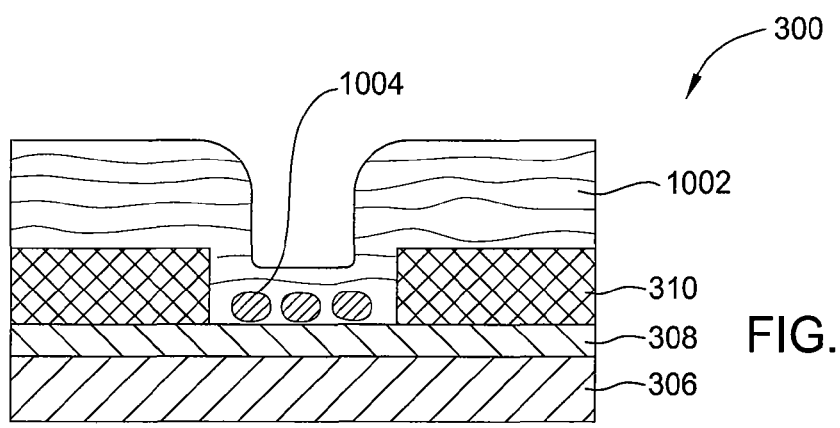
FIGS. 10A-10B are a sequence of cross-sectional views of a film stack performing a descum process on a film stack having a polymer layer disposed thereon according to one embodiment of the invention.
Figure 10B:
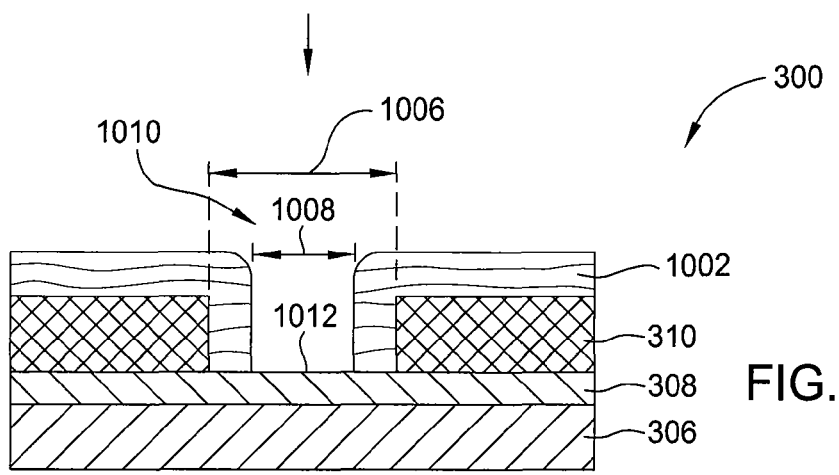

Prior to the process 200 as described in FIG. 2 is performed on the substrate 100, a descum process is typically performed to conventionally remove the residuals 902 or by-products remaining on the substrate surface. As shown in FIG. 9A, residuals and/or scum 902 may be present on the substrate surface before the descum process is performed. The descum process is performed to remove the scum 902 from the substrate surface, as shown in FIG. 9B. However, during conventional descum processes, the patterned photoresist layer 310 may be consumed, as shown by arrows 904, thereby leaving non-uniform surface on the patterned photoresist layer 310, striation or distorted profile on the descumed structure of the film stack 300. Accordingly, in order to prevent striation from occurring during descumming process, a polymer deposition of photoresist (PDP) process, as described above, may be performed to deposit a polymer layer 1002 to encapsulate the scum 1004 and or other associated residuals remaining on the substrate 100, as shown in FIG. 10A, prior to performing the descum process. Subsequently, a descum process may be performed to remove the scum 1004 from the substrate surface, as shown in FIG. 10B, as well as leaving a desired thickness of the polymer layer 1002 on the patterned photoresist layer 310. Similar to the description above, the polymer layer 1002 remaining on the substrate surface reduces the dimension 1006 of the opening 1010 defined between the photoresist layer 1002 to a narrower width 1008. An opening area 1012 defined by the narrower width 1008 of the polymer layer 1002 provides a mask for subsequent etching process, such as the etching process 200 described in FIG. 2, for forming structures in the dielectric layer 304.

Ashing

As described in blocks 209, 211, 213 in process 200 of FIG. 2, the ashing process may be performed before, during or after the etch stop layer removal process. The ashing process is performed by supplying an oxygen containing gas into the etching chamber to remove the remaining mask layers, such as photoresist layer 310, hardmask layer 308, and image transferring layer 306 from the dielectric layer 304 disposed on the substrate 100. In some embodiments wherein the underlying devices formed in the substrate 100 below the etch stop layer 302 may be exposed after the etch stop layer 302 has been removed, the ashing process may be performed before the etch stop layer removal process. Performing the ashing process 209 prior to the etch stop layer removal process prevents the underlying devices from oxidizing during ashing. Alternatively, in embodiments wherein the etch stop layer 302 is etched using more than one step, the ashing process 211 may be performed in between the steps of removing the etch stop layer 302, e.g., performing the ashing process 211 before the etch stop layer 302 is completely opened to expose the underlying layers disposed on the substrate 100. In yet another embodiment, the ashing processing 213 may be performed after the etch stop layer 302 is completely opened to expose the underlying substrate 100.

Additionally, after several cycles of the polymer deposition of photoresist (PDP) and etching processes have been performed during different stages of the process 200, some polymer material may accumulate on the backside of the substrate 100. Accordingly, a higher source plasma power, such as a plasma source power greater than about 1000 Watts, may be used to assist the backside polymer layer removal from the substrate 100. Additionally, a higher process pressure, such as pressure greater than 100 mTorr, may be used to assist generating isotropic ashing for backside polymer removal.

Posting Etching Treatment (PET)

As described at block 214 of the process 200 of FIG. 2, a post etch treatment may be performed after the desired structures have been formed on the substrate. The post etch treatment process is performed to remove surface residuals generated from etching process previously performed on the substrate 100. A gas mixture supplied to treat the substrate includes an oxygen-free carrier gas. Suitable examples of oxygen-free carrier gas include $N_2$, $H_2$, Ar, He and the like. In an exemplary embodiment described herein, the gas mixture used to treat the substrate surface includes $N_2$ and $H_2$. The ratio between the $N_2$ and $H_2$ gas may be between about 2 and about 1. A higher source plasma power, such as a plasma source power greater than about 1000 Watts, and a lower bias power, such as less than 100 Watts, may be used to treat and remove residuals from the substrate surface. Higher source power assists removing residuals from the substrate surface while lower bias power prevents the substrate from plasma attack, thereby preventing plasma damage to devices formed on the substrate.

In-Situ Etching Chamber Clean (ICC)

As described at block 216 of the method 200 of FIG. 2, after the residual has been removed from the substrate surface, the substrate 100 is removed from the etching chamber. Due to the several cycles of the polymer deposition process that has been performed in the etching chamber, a cleaning process is performed to remove any residual from chamber before the next substrate to be process is transferred into the chamber. In one embodiment, the cleaning process may be performed by supplying an oxygen containing gas, such as $O_2$, into the chamber to react with the polymer and/or residuals and removed it from the chamber. Different process pressures may be applied during the oxygen gas cleaning process.

It is noted that each block as described in FIG. 2 may be individually performed or optionally performed for etching each specific film disposed on a substrate. Additionally, the process performed in each block of process 200 may be repeatedly performed prior to the process described in the next block of the process 200 or be rearranged in any manners suitable to achieve a desired structure formation.

Figure 11:
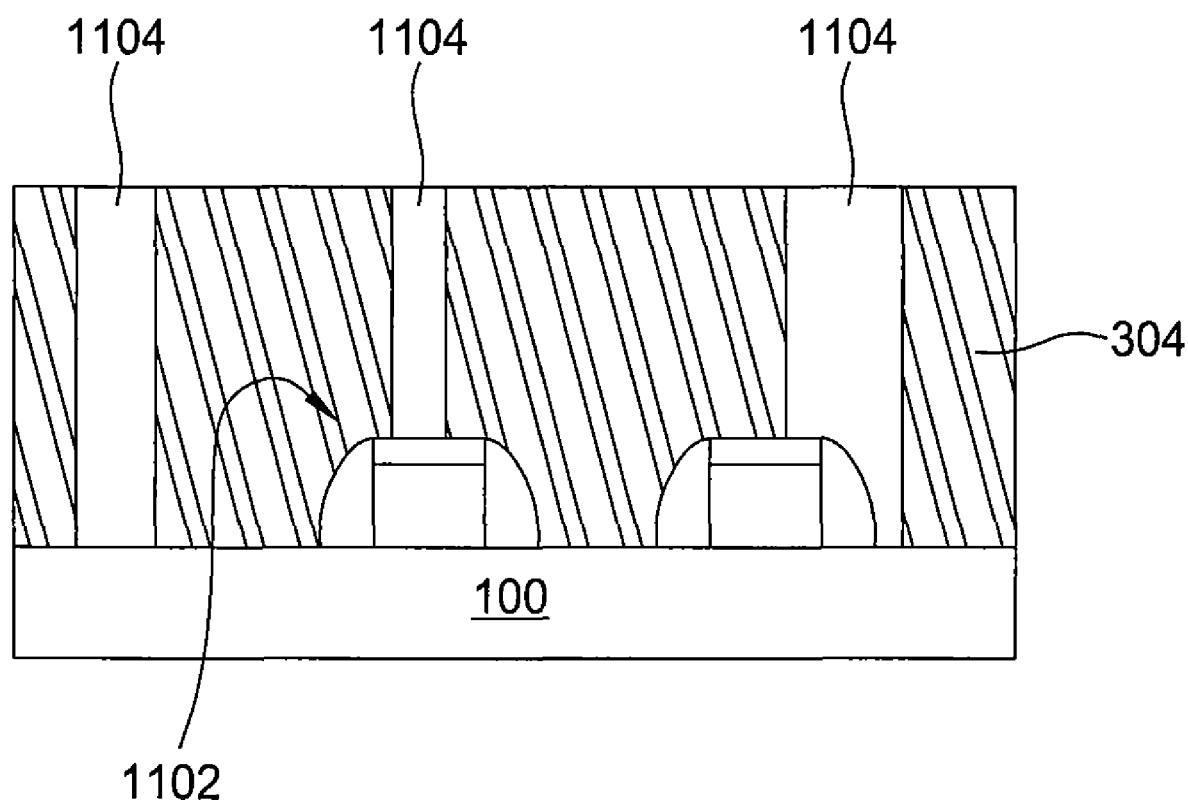
FIG. 11 is a cross-sectional view of a composite structure having ultra thin structure formed by the present invention in a contact structure for field effect transistors.

The process 200 as described in FIG. 2 may be performed to form any features and/or structures on the substrate. In a particular embodiment described herein, the film stack 300 disposed on the substrate 100 may be etched to form a contact structure on the substrate 100, as shown in FIG. 11. The dielectric layer 304 is disposed on the substrate 100 having devices 1102 formed therein. After the etching process 200 has been completed, the contact structure 1104, such as via holes, is formed within the dielectric layer 304 with desired reduced critical dimension and width as compared to conventional techniques.

It is noted that the process 200 may be performed in a single chamber. By switching different gas mixtures and process parameters at different stages of the etching process in the chamber, a contact structure with desired submicron critical dimension may be formed on a substrate. Although the exemplary embodiment of the etching method described herein is used to form a contact structure, it is noted that the etching method may be utilized to form other structures.

Thus, embodiments of the present invention provide an improved method for forming a structure on a substrate having a submicron critical dimension less than 55 nm and beyond. The present invention advantageously provides a manner for forming structures on a substrate by multiple cycles of polymer deposition of photoresist (PDP) process and mask open etching process, thereby preventing striation and critical dimension loss in etched structures.

While the foregoing is directed to embodiments of the present invention, other and further embodiments of the invention may be devised without departing from the basic scope thereof, and the scope thereof is determined by the claims that follow.

What is claimed is:

1. A method of forming a submicron structure for conductive pathways for semiconductor devices on a substrate, comprising:
    (a) providing a substrate having a patterned photoresist layer disposed on a film stack into an etch chamber, wherein the film stack includes at least a hardmask layer disposed on a dielectric layer;
    (b) performing a polymer deposition process to deposit a polymer layer on the patterned photoresist layer to reduce a dimension of an opening of the patterned photoresist layer; and
    (c) etching the hardmask layer with the reduced dimension of the opening of the patterned photoresist layer to form a patterned hardmask layer.

2. The method of claim 1, further comprising:
    exposing the dielectric layer through an opening in the hardmask layer etched through the reduced dimension opening in the patterned photoresist layer.

3. The method of claim 1, further comprising:
    repeating (b) and (c) until the dielectric layer is exposed through the reduced dimension opening formed in the patterned photoresist layer.

4. The method of claim 2, further comprising:
    etching the exposed dielectric layer through the opening in the patterned hardmask layer.

5. The method of claim 1, wherein the film stack further includes an image transferring layer disposed between the hardmask layer and the dielectric layer.

6. The method of claim 5, further comprising:
    (d) performing a polymer deposition process to deposit a polymer layer on the patterned hardmask layer, thereby reducing a dimension of an opening etched at (c); and
    (e) etching the image transferring layer with the reduced dimension opening of the patterned hardmask layer to form a patterned image transferring layer.

7. The method of claim 6, further comprising:
    repeating (d) and (e) until the dielectric layer is exposed.

8. The method of claim 6, further comprising:
    exposing the dielectric layer through the reduced dimension opening of the patterned image transferring layer.

9. The method of claim 7, further comprising:
    performing a polymer deposition process to deposit a polymer layer on the patterned image transferring layer to reduce a dimension of an opening of the patterned photoresist layer; and
    etching the dielectric layer through the reduced dimension opening.

10. The method of claim 1, wherein providing the substrate further comprises:
    performing the polymer deposition process to encapsulate scum present on the substrate with a polymer cap.

11. The method of claim 10, wherein the performing further comprises:
    removing a portion of the polymer cap of the patterned photoresist layer while reducing the dimension of the opening of the patterned photoresist layer.

12. The method of claim 4, wherein the film stack further includes an etch stop layer disposed between the dielectric layer and the substrate.

13. The method of claim 12, further comprising:
etching the etch stop layer through the opening formed in the dielectric layer to expose the substrate.

14. The method of claim 13, further comprising:
performing an ashing process before the etch stop layer has been removed from the substrate.

15. The method of claim 1, further comprising:
performing a post treatment process on the etched substrate.

16. The method of claim 1, wherein the performing the polymer deposition process at (b) further comprises:
supplying a gas mixture selected from a group consisting of $CH_4$, $CH_2F_2$, $CH_3F$, $C_2H_4$, $C_3H_8$, $C_3H_6$, $CF_4$, $CO_2$, $C_5F_8$, $CHF_3$, $C_4F_6$ and CO.

17. The method of claim 1, wherein the etching the hardmask layer at (c) further comprises:
supplying a gas mixture selected from a group consisting of $CF_4$, $CHF_3$, CO, $CO_2$, $NH_3$, $SO_2$, $CH_4$, $C_2H_4$, $C_3H_8$ and $C_3H_6$.

18. The method of claim 4, wherein the etching the dielectric layer further comprises:
supplying a gas mixture including $C_4F_8$ and at least one gas selected from a group consisting of $CF_4$, $C_4F_6$, $CHF_3$, $CH_4$, $CH_3F$, CO, $CO_2$ and $CH_2F_2$.

19. The method of claim 18, wherein the gas mixture supplied to etch the dielectric layer include $C_4F_8$ and $C_4F_6$, and wherein ratio of the $C_4F_8$ gas to the $C_4F_6$ gas is between about 0.2 and about 1.5.

20. The method of claim 18, wherein the gas mixture used to etch the dielectric layer has a selectivity to the dielectric layer over the hardmask layer between about 3 and about 7.5.

* * * * *